United States Patent [19]
Lin et al.

[11] Patent Number: 5,874,353
[45] Date of Patent: Feb. 23, 1999

[54] METHOD OF FORMING A SELF-ALIGNED SILICIDE DEVICE

[75] Inventors: Tony Lin, Kao Hsiung Hsien; Water Lur; Shih-Wei Sun, both of Taipei, all of Taiwan

[73] Assignee: United Microelectronics Corporation, Taiwan

[21] Appl. No.: 927,321

[22] Filed: Sep. 11, 1997

[30] Foreign Application Priority Data

Jul. 31, 1997 [TW] Taiwan .................................. 86110919

[51] Int. Cl.$^6$ .................... H01L 21/3205; H01L 21/4763
[52] U.S. Cl. .......................... 438/592; 438/653; 438/655; 438/657; 438/296; 257/413
[58] Field of Search ...................... 438/592, 653, 438/655, 657, 296; 257/412, 413, 751, 754, 757

[56] References Cited

U.S. PATENT DOCUMENTS

| | | | |
|---|---|---|---|
| 5,441,914 | 8/1995 | Taft et al. ................................ | 438/592 |
| 5,506,166 | 4/1996 | Sandhu et al. .......................... | 438/653 |
| 5,559,047 | 9/1996 | Urabe ...................................... | 438/592 |
| 5,597,745 | 1/1997 | Byun et al. . | |
| 5,633,196 | 5/1997 | Zamanian ................................ | 438/653 |
| 5,668,040 | 9/1997 | Byun ....................................... | 438/396 |

*Primary Examiner*—Richard A. Booth
*Attorney, Agent, or Firm*—Rabin & Champagne, P.C.

[57] ABSTRACT

A method of forming self-aligned silicide devices which includes providing a silicon substrate having shallow trench isolation regions for defining a device area formed therein; then, forming sequentially a gate oxide layer, a polysilicon layer, a first titanium nitride layer, a titanium silicide layer, a second titanium nitride layer and a silicon nitride layer over the substrate. After a gate electrode is etched out from the above layers, a titanium layer is deposited over the device, and then a self-aligned titanium silicide layer is formed using a heating process. The use of a titanium silicide layer having protective top and bottom titanium nitride layers, compared with a single tungsten silicide layer in a conventional method, provides for a self-aligned silicide device having a rather low gate resistance; being free from narrow width effect of a titanium self-aligned silicide layer; is applicable to self-aligned contact window processes, and avoids the cross-diffusion of doped ions in the polysilicon layer of a dual gate electrode having a tungsten polycide layer.

16 Claims, 2 Drawing Sheets

METHOD OF FORMING A SELF-ALIGNED SILICIDE DEVICE

BACKGROUND OF THE INVENTION

1. Field of Invention

The present invention relates to a method of manufacturing a semiconductor device. More particularly, the present invention relates to a method of forming a self-aligned silicide device.

2. Description of Related Art

As the level of integration for MOS devices is increased, resistance in the source/drain terminals of the MOS device gradually rises to a value comparable to the channel resistance of the MOS device. To ensure integrity at the shallow junction between metallic contacts and the MOS terminals, and for the downward adjustment of sheet resistance in the source/drain terminals, self-aligned silicide processes are now employed in the manufacturing of very large scale integrated (VLSI) circuits, especially for the manufacturing of semiconductor devices having a line width smaller than about 0.5 $\mu$m.

When the density of integrated circuits is further increased by shrinking the device dimensions to the deep submicron level, a dual gate electrode such as an N-type/P-type gate electrode is necessary. The dual gate electrode is formed by depositing a layer of tungsten silicide ($WSi_x$) over an ion doped polysilicon layer, and then etching the tungsten silicide layer and the polysilicon layer to form a tungsten polycide gate. However, the tungsten silicide formed using the conventional method has a high sheet resistance. Therefore, the channel length of the device is incapable of being shrunk very much. Furthermore, the doped ions in the polysilicon layer are able to cross-diffuse when subsequent thermal processes are performed.

FIGS. 1A through 1D are a series of cross-sectional views showing the progression of manufacturing steps in the production of a self-aligned silicide device according to a conventional method. First, as shown in FIG. 1A, a silicon substrate 10 is provided. Then, shallow trench isolation regions 11, a gate oxide layer 12a and a polysilicon layer 13a are sequentially formed above the substrate 10. The shallow trench isolation regions 11 are formed using an anisotropic dry etching method to form shallow trenches in the substrate 10, and then depositing silicon dioxide to fill up the trenches. The shallow trench isolation regions 11 serve to define the device active area 9. The gate oxide layer 12a can be formed, for example, by depositing a silicon dioxide layer. The polysilicon layer 13a has a thickness of about 1000–3500 Å, and can be formed, for example, by using a low pressure chemical vapor deposition (LPCVD) method.

Next, as shown in FIG. 1B, a tungsten silicide layer 14a is deposited over the polysilicon layer 13a. For example, tungsten hexafluoride ($WF_6$) is used as a source gas to react chemically with silane ($SiH_4$) or dichlo-silane ($SiH_2Cl_2$) at a temperature of about 300°–600° C., and then the tungsten silicide layer 14a is deposited using a low pressure chemical vapor deposition process. Subsequently, a silicon nitride layer 15a is deposited over the tungsten silicide layer 14a. The silicon nitride layer 15a can be deposited, for example, using a low pressure chemical vapor deposition method.

Next, as shown in FIG. 1C, using conventional photolithographic and etching techniques, the gate oxide layer 12a, the polysilicon layer 13a, the tungsten silicide layer 14a and the silicon nitride layer 15a are patterned and then etched to form a gate oxide layer 12b, a polysilicon layer 13b, a tungsten silicide layer 14b, a silicon nitride layer 15b, and which exposes the remaining substrate 10 surface. The stacked polysilicon layer 13b, the tungsten silicide layer 14b and the silicon nitride layer 15b together constitute a composite gate electrode.

Finally, as shown in FIG. 1D, spacers 16 are formed around the periphery of the gate electrode, covering portions of the substrate 10. Thereafter, a titanium layer is sputtered over the spacers 16 and the exposed portions of the substrate 10. Then, rapid thermal processing is carried out to form titanium silicide layers 17 above the substrate 10 on each side of the gate electrode.

For the above conventional method, since the tungsten silicide layer 14b of the composite gate electrode layer has a high sheet resistance, the channel length of the device cannot be shrunk very much. In addition, the doped ions in the polysilicon layer of a dual gate electrode may experience heating due to subsequent thermal treatments, which may lead to a cross-diffusion of ions. Therefore, the device performance is greatly lowered.

In light of the foregoing, there is a need in the art for improving the method of forming a self-aligned silicide device.

SUMMARY OF THE INVENTION

Accordingly, the present invention is directed to an improvement in the forming of a self-aligned silicide device.

To achieve this and other advantages and in accordance with the purpose of the invention, as embodied and broadly described herein, the invention includes providing a silicon substrate having shallow trench isolation regions for defining a device area. Then, forming sequentially a gate oxide layer and a polysilicon layer over the substrate. A thin first titanium nitride is formed over the polysilicon layer. Next, a titanium layer is deposited over the first titanium nitride layer, and then the titanium is reacted with the polysilicon layer to form a titanium silicide layer and a second titanium nitride layer using a thermal treatment method. In this invention, the titanium silicide layer and the second titanium nitride layer can also be sequentially formed using direct deposition using a chemical vapor deposition method or a physical vapor deposition method. Subsequently, a silicon nitride layer is formed over the second titanium nitride layer, and then the polysilicon layer, the first titanium nitride layer, the titanium silicide layer and the second titanium nitride layer are etched to define a composite stacked gate electrode exposing the substrate in the remaining device area. Thereafter, spacers are formed around the gate electrode, and then a titanium layer is deposited over the spacers and the exposed portions of the substrate. Next, the titanium is to react with the substrate silicon by suitable thermal treatment to form a self-aligned silicide layer. Lastly, a wet etching method is used to remove the unreacted titanium layer.

A first characteristic of this invention is the use of a titanium silicide layer having protective top and bottom titanium nitride layers, compared with a single tungsten silicide layer in the conventional method. Therefore, the self-aligned silicide device produced by the invention has the advantages of being applicable for the production of submicron devices; a rather low gate resistance; being free from the narrow width effect of a conventional titanium self-aligned silicide process; and being able to avoid the cross-diffusion of doped ions into the polysilicon layer of a dual gate electrode having a tungsten polycide layer formed thereon.

A second characteristic of this invention is that the composite stacked gate electrode formed by the first titanium nitride layer, the titanium silicide layer and the second titanium nitride layer is applicable for the production of a dual gate electrode. Because the titanium silicide layer, the first and the second titanium nitride layers do not need high temperature processing to attain a low resistance, cross-diffusion of doped ions into a polysilicon layer having a tungsten silicide layer formed thereon, such as in a conventional method, is avoided.

A third characteristic of this invention is that the method can be applied to self-aligned contact window processes.

It is to be understood that both the foregoing general description and the following detailed description are exemplary, and are intended to provide further explanations of the invention as claimed.

BRIEF DESCRIPTION OF THE DRAWINGS

The accompanying drawings are included to provide a further understanding of the invention and are incorporated in and constitute a part of this specification. The drawings illustrate an embodiment of the invention and, together with the description, serve to explain the principles of the invention. In the drawings.

DESCRIPTION OF THE PREFERRED EMBODIMENT

Figure 1A:
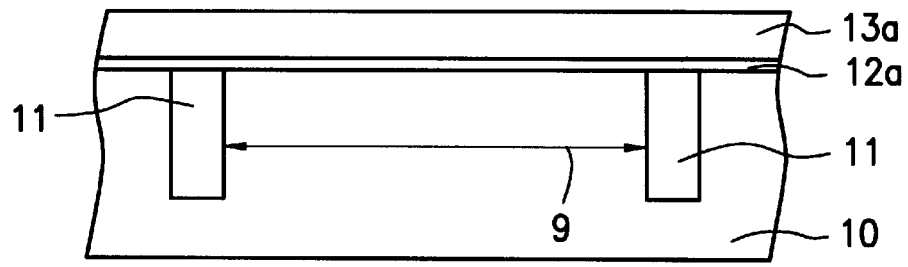
FIGS. 1A through 1D are a series of cross-sectional views showing the progression of manufacturing steps in the production of a self-aligned silicide device according to a conventional method.
Figure 1B:
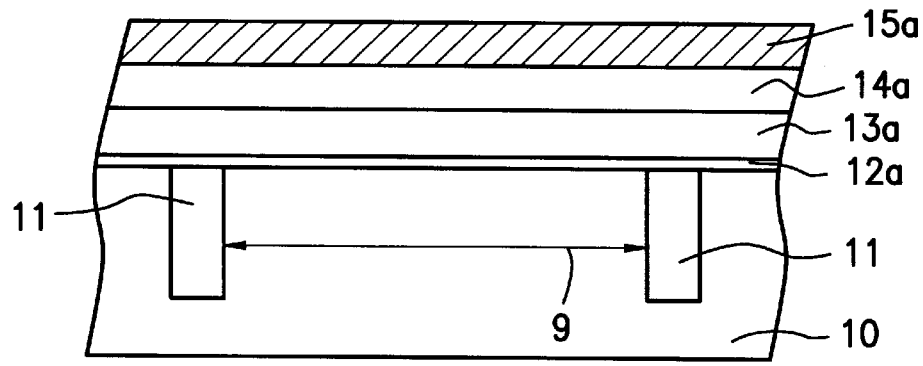
Figure 1C:
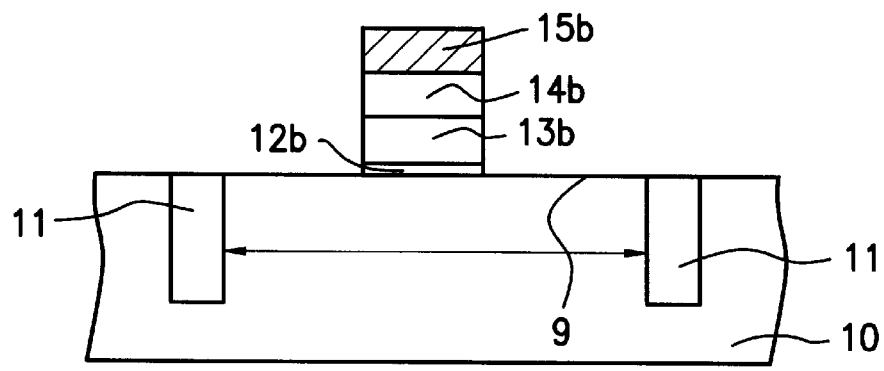
Figure 1D:
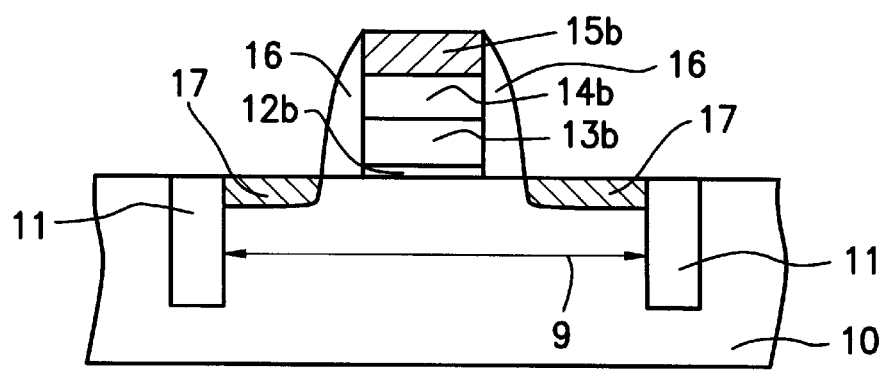

Reference will now be made in detail to the present preferred embodiment of the invention, an example of which is illustrated in the accompanying drawings. Wherever possible, the same reference numbers are used in the drawings and the description to refer to the same or like parts.

Figure 2A:
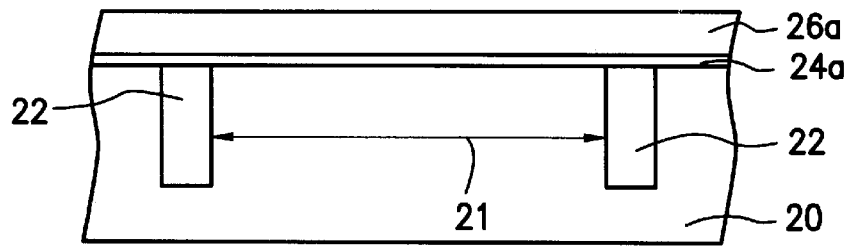
FIGS. 2A through 2D are a series of cross-sectional views showing the progression of manufacturing steps in the production of a self-aligned silicide device according to one preferred embodiment of this invention.

FIGS. 2A through 2D are a series of cross-sectional views showing the progression of manufacturing steps in the production of a self-aligned silicide device according to one preferred embodiment of this invention. As shown in FIG. 2A, a silicon substrate 20 is provided. Then, using a conventional method, shallow trench isolation regions 22 are formed in the substrate 20. Then a gate oxide layer 24a and a polysilicon layer 26a are formed sequentially over the substrate 20 and the shallow trench isolation regions 22. The shallow trench isolation regions 22 are used to define a device area 21.

Figure 2B:
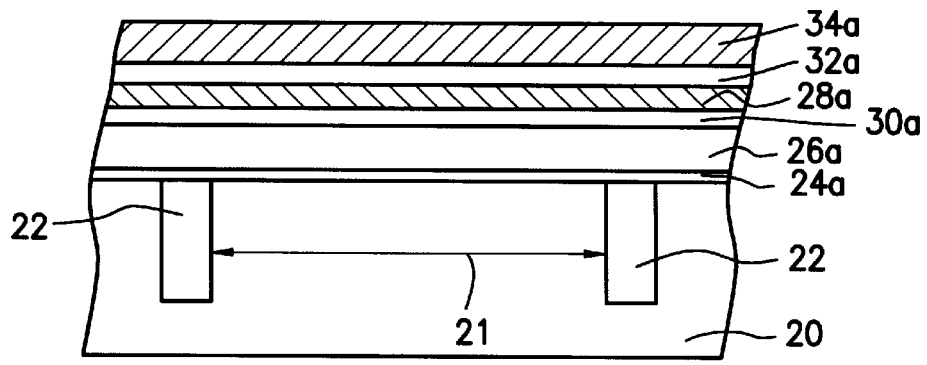

Next, in FIG. 2B, a very thin first titanium nitride (TiN) layer 30a is deposited over the polysilicon layer 26a. The first titanium nitride layer 30a can be formed using a reactive sputtering method, and the layer has a thickness of about 5–50 Å. Then, a titanium layer having a thickness of about 200–800 Å is deposited over the titanium nitride layer 30a using a sputtering method. Thereafter, gaseous nitrogen is passed, and then rapid thermal processing is performed to make portions of the titanium layer react with silicon to form a titanium silicide (TiSi$_2$) layer 28a. The remaining portions of the titanium layer react with the gaseous nitrogen to form a second titanium nitride layer 32a over the titanium silicide layer 28a. In a subsequent step, a silicon nitride layer 34a having a thickness of about 300–2000 Å is deposited over the second titanium nitride layer 32a. The silicon nitride layer 34a is formed using a low pressure chemical vapor deposition method.

In this invention, an alternative method of forming the stack of layers, including the first titanium nitride layer 30a, the titanium silicide layer 28a, and the second titanium nitride layer 32a is to use a chemical vapor deposition method or a physical vapor deposition method. For example, the first titanium nitride, the titanium silicide and the second titanium nitride can be directly deposited sequentially over the polysilicon layer 26a.

Figure 2C:
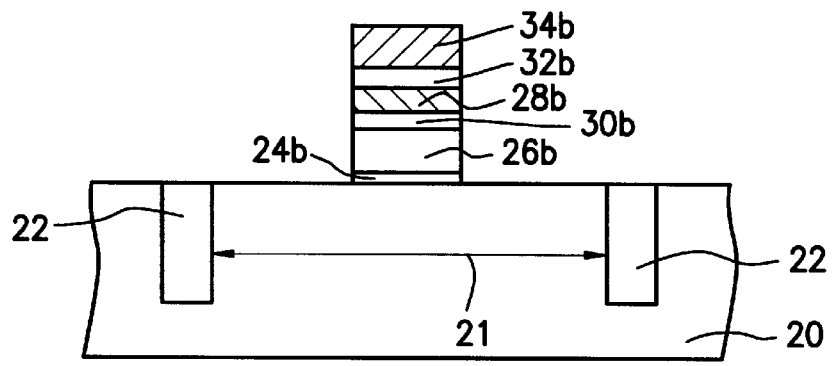

Next, as shown in FIG. 2C, conventional photolithographic and etching processes are used to define sequentially the stacked layers, including the gate oxide layer 24a, the polysilicon layer 26a, the first titanium nitride layer 30a, the titanium silicide layer 28a, the second titanium nitride layer 32a and the silicon nitride layer 34a, to form the corresponding gate oxide layer 24b, polysilicon layer 26b, first titanium nitride layer 30b, titanium silicide layer 28b, second titanium nitride layer 32b, and silicon nitride layer 34b, and expose portions of the substrate 20 in the device area 21. The resulting stacked polysilicon layer 26b, the first titanium nitride layer 30b, the titanium silicide layer 28b, the second titanium nitride layer 32b and the silicon nitride layer 34b together constitute a gate electrode.

Figure 2D:
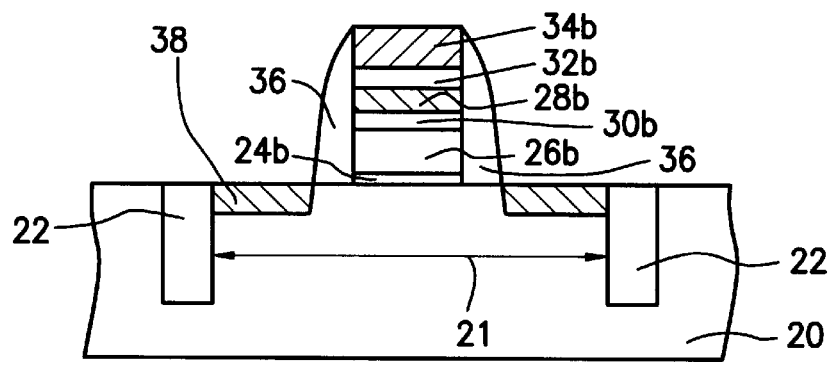

Next, in FIG. 2D, spacers 36 are formed around the gate electrode and the gate oxide layer 24b. The spacers 26 can be, for example, a silicon nitride layer or a silicon oxide layer. Thereafter, a titanium layer is deposited over the spacers 36 and the exposed portions of the substrate 20. Then the titanium is caused to react with the silicon in substrate 20 to form a self-aligned silicide layer 38 by using a rapid thermal processing method. Finally, a wet etching method is used to remove the unreacted titanium over the substrate 20.

A first characteristic of this invention is the use of a titanium silicide layer having protective top and bottom titanium nitride layers, compared with a single tungsten silicide layer used in a conventional method. Therefore, the self-aligned silicide device produced by the invention has the advantages of being applicable for the production of submicron devices; having a rather low gate resistance; being free from the narrow width effect of a conventional titanium self-aligned silicide process; and being able to avoid the cross-diffusion of doped ions in the polysilicon layer of a dual gate electrode having a tungsten polycide layer formed thereon.

A second characteristic of this invention is that the composite stacked gate electrode formed by the first titanium nitride layer, the titanium silicide layer and the second titanium nitride layer is applicable for the production of a dual gate electrode. Because the titanium silicide layer, the first and the second titanium nitride layers do not need high temperature processing to attain a low resistance, cross-diffusion of doped ions in the polysilicon layer having a tungsten silicide layer formed thereon, such as in the conventional method, is avoided.

A third characteristic of this invention is that the method can be applied to self-aligned contact window processes.

It will be apparent to those skilled in the art that various modifications and variations can be made to the present invention without departing from the scope or spirit of the invention. In view of the foregoing, it is intended that the present invention cover modifications and variations provided they fall within the scope of the following claims and their equivalents.

What is claimed is:

1. A method of forming a self-aligned silicide device, comprising:

provide a silicon substrate having shallow trench isolation regions therein which define a device area;

forming a gate oxide layer over the substrate and the shallow trench isolation regions;

forming a polysilicon layer over the gate oxide layer;

forming a first titanium nitride layer over the polysilicon layer;

forming a titanium silicide layer over the first titanium nitride layer;

forming a second titanium nitride layer over the titanium silicide layer;

forming a silicon nitride layer over the second titanium nitride layer;

patterning and then etching the polysilicon layer, the first titanium nitride layer, the titanium silicide layer, the second titanium nitride layer and the silicon nitride layer to form a stacked composite gate electrode, and expose portions of the substrate in the device area;

forming spacers around the gate electrode;

depositing a titanium layer over the spacers and the exposed portions of the substrate;

heating the titanium layer and the substrate causing them to react and form a self-aligned titanium silicide layer; and removing any unreacted portion of the titanium layer using wet etching.

2. The method of claim 1, wherein said forming a polysilicon layer includes using low pressure chemical vapor deposition.

3. The method of claim 1, wherein said forming a first titanium nitride layer includes using reactive sputtering.

4. The method of claim 1, wherein said forming a titanium silicide layer and said forming a second titanium nitride layer include the following operations:

depositing a titanium layer over the first titanium nitride layer; and passing gaseous nitrogen and then performing rapid thermal processing to cause silicon to react with portions of the titanium layer to form the titanium silicide layer over the first titanium nitride layer, and to cause the nitrogen to react with a remaining portion of the titanium layer to form the second titanium nitride layer over the titanium silicide layer.

5. The method of claim 1, wherein said forming a titanium silicide layer includes depositing titanium over the first titanium nitride layer using chemical vapor deposition.

6. The method of claim 1, wherein said forming a titanium silicide layer includes depositing titanium over the first titanium nitride layer using physical vapor deposition.

7. The method of claim 1, wherein said forming a second titanium nitride layer includes depositing titanium nitride over the titanium silicide layer using chemical vapor deposition.

8. The method of claim 1, wherein said forming a second titanium nitride layer includes depositing titanium nitride over the titanium silicide layer using physical vapor deposition.

9. The method of claim 1, wherein said forming a silicon nitride layer includes using low pressure chemical vapor deposition.

10. The method of claim 1, wherein said heating the titanium layer and the substrate includes using rapid thermal processing.

11. The method of claim 1, wherein said forming a polysilicon layer includes depositing polysilicon to a thickness of about 1000–3500 Å.

12. The method of claim 1, wherein said forming a first titanium nitride layer includes depositing titanium nitride to a thickness of about 5–50 Å.

13. The method of claim 1, wherein said forming a silicon nitride layer includes depositing silicon nitride to a thickness of about 300–2000 Å.

14. The method of claim 1, wherein said forming spacers includes depositing silicon nitride.

15. The method of claim 1, wherein said forming spacers includes depositing silicon oxide.

16. A method of forming a composite electrode, comprising:

forming a first titanium nitride layer over a polysilicon layer;

forming a titanium silicide layer over the first titanium nitride layer;

forming a second titanium nitride layer over the titanium silicide layer; and forming a silicon nitride layer over the second titanium nitride layer, wherein the polysilicon layer, first titanium nitride layer, titanium silicide layer and silicon nitride layer together form a composite electrode.

* * * * *